US010825887B2

(12) United States Patent
Qin et al.

(10) Patent No.: US 10,825,887 B2
(45) Date of Patent: Nov. 3, 2020

(54) FLEXIBLE DISPLAY PANEL, FLEXIBLE DISPLAY DEVICE AND METHOD OF MANUFACTURING THE FLEXIBLE DISPLAY PANEL

(71) Applicant: WUHAN CHINA STAR OPTOELECTRONICS SEMICONDUCTOR DISPLAY TECHNOLOGY CO., LTD., Wuhan, Hubei (CN)

(72) Inventors: Fang Qin, Hubei (CN); Quan Hu, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 14 days.

(21) Appl. No.: 16/312,735

(22) PCT Filed: Nov. 7, 2018

(86) PCT No.: PCT/CN2018/114437
§ 371 (c)(1),
(2) Date: Dec. 21, 2018

(87) PCT Pub. No.: WO2020/056884
PCT Pub. Date: Mar. 26, 2020

(65) Prior Publication Data
US 2020/0091272 A1 Mar. 19, 2020

(30) Foreign Application Priority Data
Sep. 18, 2018 (CN) .......................... 2018 1 1086340

(51) Int. Cl.
*H01L 27/32* (2006.01)

(52) U.S. Cl.
CPC .. *H01L 27/3279* (2013.01); *H01L 2251/5338* (2013.01)

(58) Field of Classification Search
CPC .................... H01L 27/3279; H01L 2251/5338
(Continued)

(56) References Cited

U.S. PATENT DOCUMENTS

2019/0019966 A1* 1/2019 Jiang .................. H01L 51/5253
2019/0273124 A1 9/2019 Leng et al.

FOREIGN PATENT DOCUMENTS

CN          207134068 U     3/2018
CN          108022942 A     5/2018
(Continued)

*Primary Examiner* — Elias Ullah

(57) ABSTRACT

The present invention discloses a flexible display panel, a flexible display device and a method of manufacturing the flexible display panel, the metal patterns of the bent region of the flexible display panel of the present invention has a double-layer structure, and the second metal layer pattern is designed with a wavy pattern, which can reduce the stress on the metal layer patterns during pad bending process, decrease the breakage probability of metal layer patterns in the bent region of the flexible display, and ensure the resistance stability of the metal layer patterns. Furthermore, the connection portion between the first metal layer pattern and the second metal layer pattern can improve the reliability, reduce the abnormal probability of display caused by the pattern breakage, and ensure normal signal transmission.

13 Claims, 3 Drawing Sheets

(58) Field of Classification Search
USPC .......................................................... 257/40
See application file for complete search history.

(56) References Cited

FOREIGN PATENT DOCUMENTS

| | | |
|---|---|---|
| CN | 108389869 A | 8/2018 |
| JP | 6080209 B2 | 2/2017 |

* cited by examiner

FLEXIBLE DISPLAY PANEL, FLEXIBLE DISPLAY DEVICE AND METHOD OF MANUFACTURING THE FLEXIBLE DISPLAY PANEL

CROSS REFERENCE TO RELATED APPLICATIONS

This application claims the priority of International Application No. PCT/CN2018/114437, filed on 2018 Nov. 7, which claims priority to Chinese Application No. 201811086340.5, filed on 2018 Sep. 18. The entire disclosures of each of the above applications are incorporated herein by reference.

BACKGROUND OF INVENTION

Field of Invention

The present invention relates to the field of display technologies, and in particular, to a flexible display panel, a flexible display device and a method of manufacturing the flexible display panel.

Description of Prior Art

As a new generation of display products, flexible display devices are attracting more and more attention due to their advantages of being ultra-light, ultra-thin, high definition, fast response times, flexible, and easy to carry. With the continuous updating of display panel technology, small-sized panels become thinner, have narrow borders, and are borderless. Pad bending is the core technology of narrow-border/borderless panels. At present, the bending radius is generally less than 0.5 mm.

Flexible displays need to be rolled up or bent during use, and even bent frequently. In the narrow-border/borderless flexible display technology, the bent regions of the flexible display are usually covered with many metal patterns. After the product is bent, the metal patterns in the bent regions are imposed with large stress, since the stress of metal patterns cannot be released in time, stress concentrations are produced and cause cracks or even breakages in the metal patterns, which lead to an increase in the resistance of the metal patterns or failure of the display product, which seriously affects service life of the flexible display.

Therefore, how to reduce the stress of metal patterns, how to decrease the breakage probability of metal patterns in the bent region of a flexible display, and how to ensure the resistance stability of metal patterns and the normal signal transmission are urgent problems to be solved in the development of flexible display and narrow-border/borderless technology.

SUMMARY OF THE INVENTION

The objects of the present invention are to provide a flexible display panel, a flexible display device, and a method of manufacturing the flexible display panel, which could reduce the metal pattern stress, decrease the breakage probability of metal patterns in the bent region of the flexible display, improve the reliability, thereby reduce the abnormal probability of display caused by the breakage of the patterns.

To achieve the above objects, the present invention provides a flexible display panel, comprising an organic layer, wherein the flexible display panel further comprises: a first metal layer pattern disposed on the organic layer, wherein the first metal layer pattern includes a plurality of first metal blocks spaced from each other and positioned corresponding to a bent region of the flexible display panel; a first organic flat layer disposed on the first metal layer pattern, and having at least one contact hole formed between each two adjacent first metal blocks positioned corresponding to the bent region; a second metal layer pattern disposed on the first organic flat layer, and forming a wavy pattern through the contact holes positioned corresponding to the bent region, and being connected to the first metal blocks in the contact holes.

To achieve the above objects, the present invention further provides a flexible display device, the flexible device comprises a flexible display panel, the flexible display panel comprises an organic layer; wherein the flexible display panel further comprises: a first metal layer pattern disposed on the organic layer, wherein the first metal layer pattern includes a plurality of first metal blocks spaced from each other and positioned corresponding to a bent region of the flexible display panel; a first organic flat layer disposed on the first metal layer pattern, and having at least one contact hole formed between each two adjacent first metal blocks positioned corresponding to the bending region; a second metal layer pattern disposed on the first flat layer, and forming a wavy pattern through the contact holes positioned corresponding to the bent region, and is connected to the first metal blocks in the contact holes.

To achieve the above objects, the present invention further provides a method of manufacturing a flexible display panel, wherein, comprising the following steps: providing an organic layer; depositing and patterning a first metal layer on the organic layer to form a first metal layer pattern, the first metal layer pattern includes a plurality of first metal blocks positioned corresponding to a bent region of the flexible display panel; forming a first organic flat layer on the first metal layer, and opening at least one contact hole between the two adjacent first metal blocks positioned corresponding to the bent region of the first organic flat layer; depositing and patterning a second metal layer on the first organic planar layer to form a second metal layer pattern, the second metal layer pattern forming a wavy pattern through the contact holes positioned corresponding to the bent region, and being connected to the first metal blocks in the contact holes.

The advantages of the present invention includes: the metal patterns of the bent region of the flexible display panel of the present invention has a double-layer structure, and the second metal layer pattern is designed with a wavy pattern, which can reduce the stress on the metal layer patterns during pad bending process, decrease the breakage probability of metal layer patterns in the bent region of the flexible display, and ensure the resistance stability of the metal layer patterns. Furthermore, the connection portion between the first metal layer pattern and the second metal layer pattern can improve the reliability, reduce the abnormal probability of display caused by the pattern breakage, and ensure normal signal transmission.

BRIEF DESCRIPTION OF DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF PREFERRED EMBODIMENTS

Figure 1:
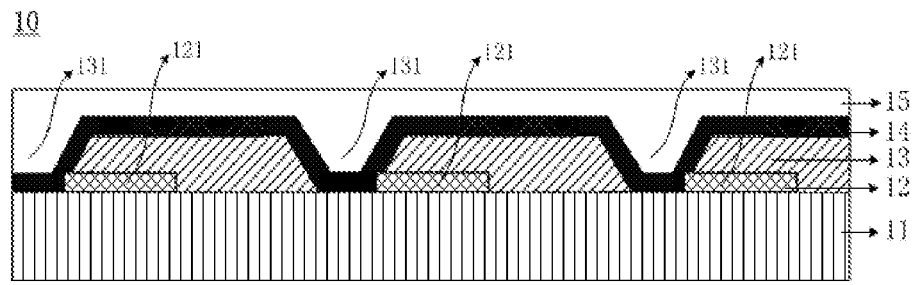
FIG. 1 is a cross-sectional diagram of the bent region of a first embodiment of a flexible display panel according to the present invention.

The embodiments of the present invention are described in detail below, and the examples of the embodiments are illustrated in the drawings, wherein the same or similar reference numerals indicate the same or similar elements or elements having the same or similar functions. The embodiments described below with reference to the drawings are intended to be illustrative of the invention and are not to be construed as limiting.

In the present invention, unless otherwise specifically stated and defined, the first feature "on" or "under" the second feature could be direct contact of the first and second features, it may also be that the first and second features are not in direct contact but are contacted by additional features between them. Moreover, the first feature is "beyond", "above" and "over" the second feature means the first feature directly above or oblique above the second feature, or merely indicating that the level of the first feature is higher than the second feature. The first feature is "below", "under" and "lower than" the second feature means the first feature directly below or oblique below the second feature, or merely indicating that the level of the first feature is lower than the second feature.

The following disclosure provides many different embodiments or examples for implementing different structures of the present invention. In order to simplify the disclosure of the present invention, the components and arrangements of the specific examples are described below. Of course, they are merely examples and are not intended to limit the invention. In addition, the present invention may be repeated with reference to the numerals and/or reference numerals in the various examples, which are for the purpose of simplicity and clarity, and do not indicate the relationship between the various embodiments and/or arrangements discussed. Moreover, the present invention provides examples of various specific processes and materials, but one of ordinary skilled in the art will recognize the use of other processes and/or the use of other materials.

The flexible display panel of the present invention designs double-layer metal patterns in the bent region, and the first metal pattern is a discontinuous block structure, the second metal pattern forms a wavy pattern through the contact holes (PLN holes) and is connected to the first metal pattern in the contact holes, which could reduce the stress on the metal layer patterns during pad bending process, decrease breakage probability of metal patterns in the bent region of the flexible display, and improve the reliability.

Specifically, the present invention provides a flexible display panel, comprising an organic layer, a first metal layer pattern and a second metal layer pattern. The first metal layer pattern disposed on the organic layer, wherein the first metal layer pattern includes a plurality of first metal blocks spaced from each other and positioned corresponding to a bent region of the flexible display panel; a first organic flat layer disposed on the first metal layer pattern, and having at least one contact hole formed between each two adjacent first metal blocks positioned corresponding to the bent region, a second metal layer pattern disposed positioned, the second metal layer pattern forming a wavy pattern through the contact holes positioned corresponding to the bent region, and being connected to the first metal blocks in the contact holes. Optionally, the first organic flat layer is provided with at least one contact hole between two adjacent first metal blocks in a direction perpendicular to the axis of the bent region.

The flexible display panel provided by the present invention has a double-layer structure, and the second metal layer pattern is designed with a wavy pattern, which can reduce the stress on the metal layer patterns during pad bending process, decrease the breakage probability of metal layer patterns in the bent region of the flexible display, and ensure the resistance stability of the metal layer patterns. Furthermore, the connection portion between the first metal layer pattern and the second metal layer pattern can improve the reliability, reduce the abnormal probability of display caused by the pattern breakage, and ensure normal signal transmission.

Referring to FIG. 1, which is a cross-sectional diagram of the bent region of a first embodiment of a flexible display panel according to the present invention. The first metal layer pattern 12 are disposed on the organic layer 11, and the first metal layer pattern 12 include a plurality of first metal blocks 121 spaced from each other and positioned corresponding to a bent region 10 of the flexible display panel. The first organic flat layer 13 is disposed on the first metal layer pattern 12, and the head of each of the first metal blocks 121 positioned corresponding to the bent region 10 of the first organic flat layer 13 are configured with a contact hole 131. The second metal layer patterns 14 are disposed on the first organic flat layer 13, and the second metal layer pattern 14 forming a wavy pattern through the contact holes positioned corresponding to the bent region 10, and being connected to the first metal blocks 121 in the contact holes 131. The second metal layer pattern is designed with a wavy pattern, which can reduce the stress on the metal layer pattern during pad bending process, decrease the breakage probability of metal patterns in the bent region of the flexible display, and ensure the resistance stability of the metal pattern. Furthermore, the connection portion between the first metal layer pattern and the second metal layer pattern can improve the reliability, reduce the abnormal probability of display caused by the pattern breakage, and ensure normal signal transmission. The material of the first metal layer and the second metal layer could be a metal such as aluminum, titanium or molybdenum, or may be one of an alloy such as an aluminum alloy, a titanium alloy or a molybdenum alloy, which is not specifically limited in the present invention. Preferably, a second organic flat layer 15 is further disposed on the second metal layer pattern 14. The second organic flat layer 15 can flat the irregularities formed by the lower metal layer (the second metal layer) to facilitate the fabrication of the upper layer circuit.

Figure 2:
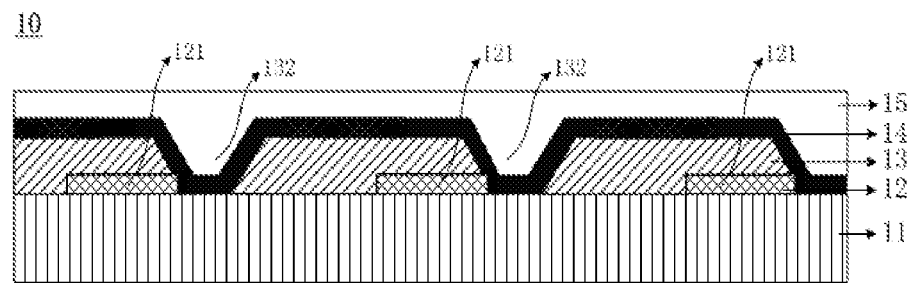
FIG. 2 is a cross-sectional diagram of the bent region of a second embodiment of the flexible display panel of the present invention.

Referring to FIG. 2, which is a cross-sectional diagram of the bent region of a second embodiment of the flexible display panel of the present invention. The difference from the first embodiment shown in FIG. 1 is that, in the embodiment, the tail of each of the first metal blocks 121 positioned corresponding to the bent region 10 of the first organic flat layer 13 is configured with a contact hole 132; the second metal layer pattern 14 forming a wavy pattern through the contact holes 132 positioned corresponding to the bent region 10, and being connected to the first metal blocks 121 in the contact holes 132.

Figure 3:
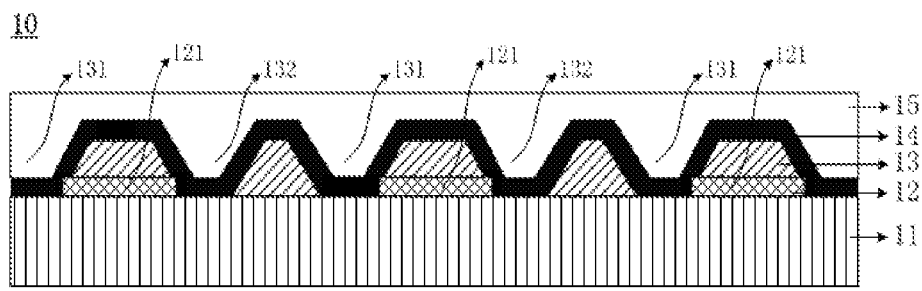
FIG. 3 is a cross-sectional diagram of the bent region of a third embodiment of the flexible display panel of the present invention.

Referring to FIG. 3, which is a cross-sectional diagram of the bent region of a third embodiment of the flexible display panel of the present invention. The difference from the first embodiment shown in FIG. 1 is that, in the embodiment, the tail of each of the first metal blocks 121 positioned corresponding to the bent region 10 of the first organic flat layer 13 is also configured with a contact hole 132; the second metal layer pattern 14 forms a wavy pattern through the contact holes 131 and 132 positioned corresponding to the bent region 10, and being connected to the first metal blocks 121 in the contact holes 131, being connected to the first metal blocks 121 in the contact holes 132.

Figure 4:
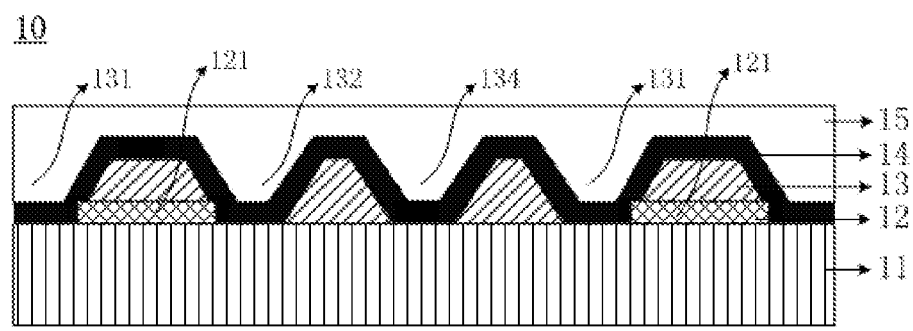
FIG. 4 is a cross-sectional diagram of the bent region of a fourth embodiment of the flexible display panel of the present invention.

Referring to FIG. 4, which is a cross-sectional diagram of the bent region of a fourth embodiment of the flexible display panel of the present invention. The difference from the first embodiment shown in FIG. 3 is that, in the embodiment, the first organic flat layer 13 has at least one through-hole 134 between each two adjacent first metal blocks 121 corresponding to the bent region 10; the second metal layer pattern 14 forms a wavy pattern through the contact holes 131, 132 and the through-holes 134 positioned corresponding to the bent region 10, and is connected to the head of the first metal blocks 121 in the contact holes 131, connected to the tail of the first metal blocks 121 in the contact holes 132. Optionally, the through-holes 134 can also be disposed as what is shown in the first embodiment shown in FIG. 1 or as that is shown in the second embodiment shown in FIG. 2. Correspondingly, the second metal layer pattern 14 forms a wavy pattern through the contact holes 131 (or contact holes 132) and the through-holes 134 positioned corresponding to the bent region 10, and is connected to the head or the tail of the first metal blocks 121 in the contact holes 131 (or contact holes 132).

The present invention also provides a flexible display device using the above flexible display panel. By engaging a double-layer structure in parts of the metal layer pattern, and the second metal layer pattern is designed with a wavy pattern, which can reduce the stress on the metal layer pattern during bending process, decrease the breakage probability of metal patterns in the bent region of the flexible display, and ensure the resistance stability of the metal patterns. Furthermore, the connection portion between the first metal layer pattern and the second metal layer pattern can improve the reliability, reduce the abnormal probability of display caused by the pattern breakage, and ensure normal signal transmission.

Figure 5:
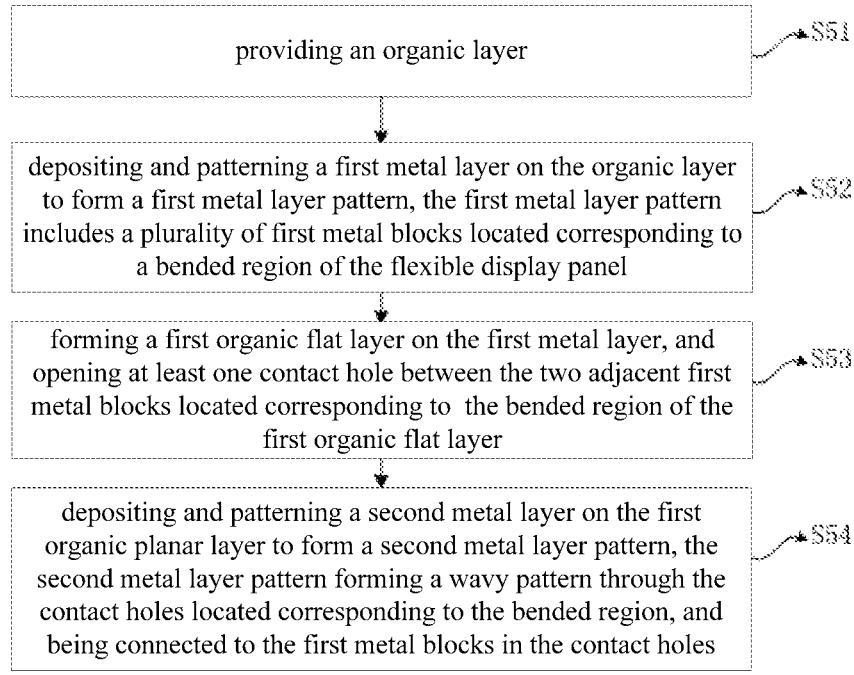
FIG. 5 is a flow chart of an embodiment of a method of manufacturing a flexible display panel according to the present invention.
Figure 6A:
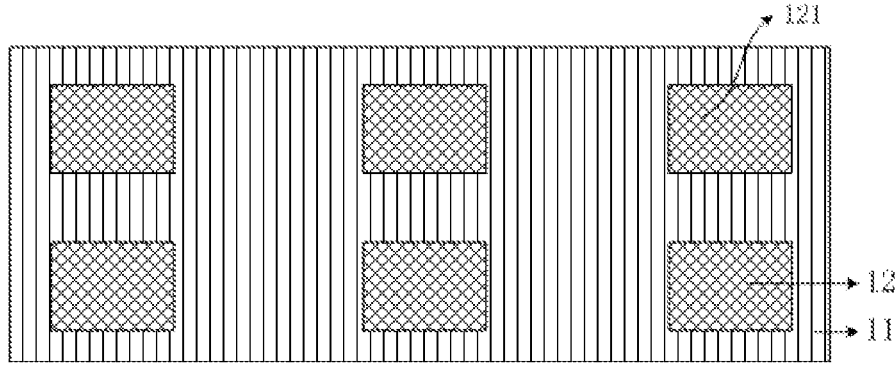
FIG. 6A-6C are flow diagrams showing the manufacturing process of an embodiment of the flexible display panel of the present invention.
Figure 6B:
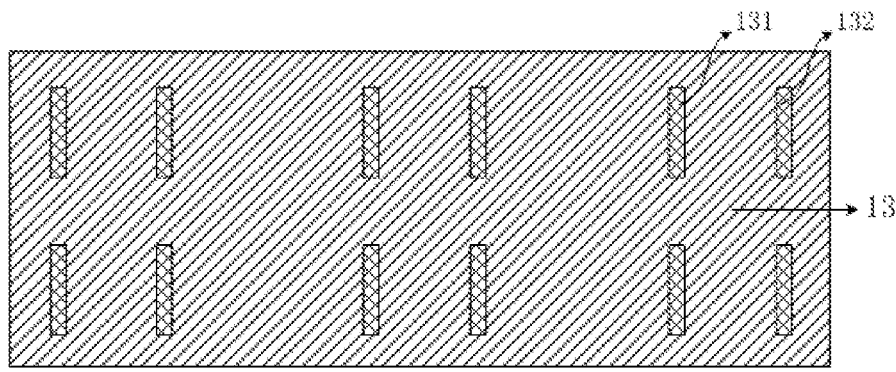
Figure 6C:
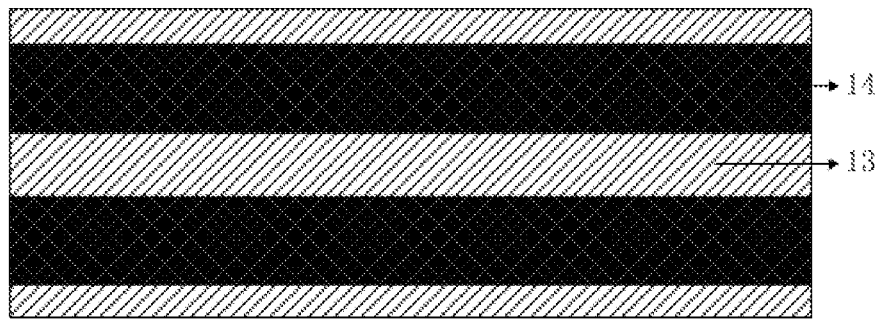

The present invention also provides a method of manufacturing a flexible display panel, with reference to FIG. 5 and FIG. 6A-6C, wherein FIG. 5 is a flow chart of an embodiment of a method of manufacturing a flexible display panel according to the present invention, FIG. 6A-6C are flow diagrams showing the manufacture process of an embodiment of the flexible display panel of the present invention. The method comprises: step S51: providing an organic layer; step S52: depositing and patterning a first metal layer on the organic layer to form a first metal layer pattern, the first metal layer pattern includes a plurality of first metal blocks positioned corresponding to a bent region of the flexible display panel; step S53: forming a first organic flat layer on the first metal layer, and opening at least one contact hole between the two adjacent first metal blocks positioned corresponding to the bent region of the first organic flat layer; step S54: depositing and patterning a second metal layer on the first organic planar layer to form a second metal layer pattern, the second metal layer pattern forming a wavy pattern through the contact holes positioned corresponding to the bent region, and being connected to the first metal blocks in the contact holes.

Regarding step S52: depositing and patterning a first metal layer on the organic layer to form a first metal layer pattern, the first metal layer pattern includes a plurality of first metal blocks positioned corresponding to a bent region of the flexible display panel, please refer to FIG. 5 and FIG. 6A. Depositing and patterning a first metal layer on the organic layer 11 to form a first metal layer pattern 12, the first metal layer pattern 12 includes a plurality of first metal blocks 121 spaced from each other and positioned corresponding to a bent region 10 of the flexible display panel. The material of the first metal layer could be a metal such as aluminum, titanium or molybdenum, or may be one of an alloy such as an aluminum alloy, a titanium alloy or a molybdenum alloy, which is not specifically limited in the present invention.

Regarding step S53: forming a first organic flat layer on the first metal layer, and opening at least one contact hole between the two adjacent first metal blocks positioned corresponding to the bent region of the first organic flat layer, please refer to FIG. 5 and FIG. 6B. The first organic flat layer 13 is disposed on the first metal layer pattern 12, and the head of each of the first metal blocks 121 positioned corresponding to the bent region 10 of the first organic flat layer 13 is configured with a contact hole 131, the tail of each of the first metal blocks 121 is configured with a contact hole 132. In other embodiments, it could be that only the head of each of the first metal blocks 121 positioned corresponding to the bent region 10 of the first organic flat layer 13 is configured with a contact hole 131, or only the tail of each of the first metal blocks 121 is configured with a contact hole 132; it could also provide at least one through-hole 134 between each two adjacent first metal blocks 121 corresponding to the bent region 10. The organic flat layer is thick enough to flat the irregularities formed by the lower metal layer to facilitate the fabrication of the upper layer circuit.

Regarding step S54: depositing and patterning a second metal layer on the first organic planar layer to form a second metal layer pattern, the second metal layer pattern forming a wavy pattern through the contact holes positioned corresponding to the bent region, and being connected to the first metal blocks in the contact holes, please refer to FIG. 5 and FIG. 6C. The second metal layer pattern 14 forms a wavy pattern through the contact holes 131 and 132 positioned corresponding to the bent region 10, and being connected to the head or tail of the first metal blocks 121 in the contact holes 131 and 132. The material of the first metal layer and the second metal layer could be a metal such as aluminum, titanium or molybdenum, or may be one of an alloy such as an aluminum alloy, a titanium alloy or a molybdenum alloy, which is not specifically limited in the present invention.

Preferably, a second organic flat layer is further disposed on the second metal layer pattern. The second organic flat layer can flat the irregularities formed by the lower metal layer to facilitate the fabrication of the upper layer circuit. A cross-sectional diagram of the bent region of the prepared flexible display panel is shown in FIG. 4.

INDUSTRIAL APPLICABILITY

The subject matter of the present application can be manufactured and used in industry, and have industrial applicability.

What is claimed is:

1. A flexible display panel, comprising an organic layer corresponding to a bent region, wherein the flexible display panel further comprises:
   a first metal layer pattern disposed on the organic layer, wherein the first metal layer pattern includes a plurality of first metal blocks spaced from each other and positioned corresponding to the bent region of the flexible display panel;
   a first organic flat layer disposed on the first metal layer pattern, and having at least one contact hole formed between each two adjacent first metal blocks positioned corresponding to the bent region;
   a second metal layer pattern disposed on the first organic flat layer, and forming a wavy pattern through the contact holes positioned corresponding to the bent region, and being connected to the first metal blocks in the contact holes.

2. The flexible display panel according to claim 1, wherein the at least one contact hole of the first organic flat layer formed between each two adjacent first metal blocks is oriented in a direction perpendicular to an axis of the bent region.

3. The flexible display panel according to claim 1, wherein each of the contact holes is disposed at a head of a corresponding first metal block, and the second metal layer pattern is connected to the heads of the corresponding first metal blocks in the contact holes.

4. The flexible display panel according to claim 1, wherein each of the contact holes is disposed at a tail of the corresponding first metal block, and the second metal layer pattern is connected to the tails of the first metal blocks in the contact holes.

5. The flexible display panel according to claim 1, wherein a head and a tail of each of the first metal blocks are both provided with the contact holes, the second metal layer pattern is connected to the heads and the tails of the first metal blocks in the contact holes.

6. The flexible display panel according to claim 1, wherein the first organic flat layer has at least one through-hole between each two adjacent first metal blocks corresponding to the bent region, the second metal layer pattern forms a wavy pattern through the contact holes and the through-holes positioned corresponding to the bent region and is connected to the first metal blocks in the contact holes.

7. A flexible display device, the flexible device comprises a flexible display panel, the flexible display panel comprises an organic layer corresponding to a bent region; wherein the flexible display panel further comprises:
   a first metal layer pattern disposed on the organic layer, wherein the first metal layer pattern includes a plurality of first metal blocks spaced from each other and positioned corresponding to the bent region of the flexible display panel;
   a first organic flat layer disposed on the first metal layer pattern, and having at least one contact hole formed between each two adjacent first metal blocks positioned corresponding to the bent region;
   a second metal layer pattern disposed on the first organic flat layer, and forming a wavy pattern through the contact holes positioned corresponding to the bent region, and is connected to the first metal blocks in the contact holes.

8. The flexible display device according to claim 7, wherein the at least one contact holes of the first organic flat layer formed between each two adjacent first metal blocks is oriented in a direction perpendicular to an axis of the bent region.

9. The flexible display device according to claim 7, wherein each of the contact holes is disposed at a head of a corresponding first metal block, and the second metal layer pattern is connected to the heads of the first metal blocks in the contact holes.

10. The flexible display device according to claim 7, wherein each of the contact holes is disposed at a tail of the corresponding first metal block, and the second metal layer pattern is connected to the tails of the first metal blocks in the contact holes.

11. The flexible display device according to claim 7, wherein a head and a tail of each of the first metal blocks are both provided with contact holes, and the second metal layer pattern is connected to the heads and the tails of the first metal blocks in the contact holes.

12. The flexible display device according to claim 7, wherein the first organic flat layer has at least one through-hole between each two adjacent first metal blocks positioned corresponding to the bent region, and the second metal layer pattern forms a wavy pattern through the contact holes and the through-holes positioned corresponding to the bent region and is connected to the first metal blocks in the contact holes.

13. A method of manufacturing a flexible display panel, wherein, comprising the following steps:
   providing an organic layer corresponding to a bent region;
   depositing and patterning a first metal layer on the organic layer to form a first metal layer pattern, the first metal layer pattern includes a plurality of first metal blocks positioned corresponding to the bent region of the flexible display panel;
   forming a first organic flat layer on the first metal layer, and opening at least one contact hole between the two adjacent first metal blocks positioned corresponding to the bent region of the first organic flat layer;
   depositing and patterning a second metal layer on the first organic planar layer to form a second metal layer pattern, the second metal layer pattern forming a wavy pattern through the contact holes positioned corresponding to the bent region, and being connected to the first metal blocks in the contact holes.

* * * * *